United States Patent
Guedon

(10) Patent No.: US 8,284,089 B2
(45) Date of Patent: Oct. 9, 2012

(54) CYCLIC DIGITAL-TO-ANALOG CONVERTER (DAC) WITH CAPACITOR SWAPPING

(75) Inventor: Yannick Guedon, Mimosa Park (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 49 days.

(21) Appl. No.: 12/963,748

(22) Filed: Dec. 9, 2010

(65) Prior Publication Data

US 2012/0146825 A1 Jun. 14, 2012

(51) Int. Cl.
*H03M 1/66* (2006.01)
(52) U.S. Cl. ............. 341/150; 455/204; 455/93; 455/98
(58) Field of Classification Search .......... 341/140–160; 455/89, 93, 98, 100, 204
See application file for complete search history.

(56) References Cited

U.S. PATENT DOCUMENTS

| | | | |
|---|---|---|---|
| 6,498,596 | B1 | 12/2002 | Nakamura et al. |
| 7,002,507 | B2 * | 2/2006 | Kobayashi et al. ........... 341/162 |
| 7,199,743 | B2 | 4/2007 | Casper et al. |
| 7,355,582 | B1 * | 4/2008 | Bell .............................. 345/100 |
| 7,423,558 | B2 * | 9/2008 | Ueno ............................. 341/50 |
| 7,425,913 | B2 | 9/2008 | Wu et al. |
| 7,551,113 | B2 * | 6/2009 | Wu et al. ....................... 341/150 |
| 2007/0216563 | A1 | 9/2007 | Wu et al. |

OTHER PUBLICATIONS

Salvatore, Di Fazio: "Algorithmic DACs, Analysis and Design," Version 1.0, no date, 27 pages.

Suarez, Ricardo E., et al: "All-MOS Charge Redistribution Analog-to-Digital Conversion Techniques—Part II," IEEE Journal of Solid-State Circuits, vol. SC-10, No. 6, Dec. 1975, pp. 379-385.

Weyten L., et al.: "Two-Capacitor DAC With Compensative Switching," Electronics Letters, Aug. 17, 1995, vol. 31, No. 17, pp. 1435-1437.

Rombouts, P., et al.: "Linearity Improvement for the Switched-Capacitor DAC," Electronics Letters, Feb. 15, 1996, vol. 32, No. 4, pp. 293-294.

Rombouts, P., et al.: "Capacitor Mismatch Compensation for the Quasi-Passive Switched-Capacitor Dac," IEEE Transactions on Circuits and Systems—1: Fundamental Theory and Applications, vol. 45, No. 1, Jan. 1998, pp. 68-71.

Bell, Marshall J.: "An LCD cOLUMN Driver Using a Switch Capacitor Dac," IEEE Journal of Solid-State Circuits, vol. 40, No. 12, Dec. 2005, pp. 2756-2765.

(Continued)

*Primary Examiner* — Lam T Mai
(74) *Attorney, Agent, or Firm* — Gardere Wynne Sewell LLP

(57) ABSTRACT

A cyclic digital-to-analog converter includes a first capacitor and a second capacitor. Switching circuitry is selectively configurable to connect the first and second capacitors is at least two modes of operation, wherein a first mode uses the first capacitor during conversion of a bit as a sampling capacitor and uses the second capacitor during conversion of that bit as a holding capacitor, and wherein a second mode uses the second capacitor during conversion of a bit as a sampling capacitor and uses the first capacitor during conversion of that bit as a holding capacitor. A controller swaps converter operation between the first and second modes based on the bit values of a digital word to be converted. If adjacent bits of the digital word to be converted have different logical values, the converter swaps from the first mode to the second mode (or from the second mode to the first mode). Otherwise, the converted remains in the current first or second mode.

19 Claims, 7 Drawing Sheets

OTHER PUBLICATIONS

Lu, Xiaochen, et al.: "Voltage Averaging Technique for Improving the Resolution of Two-Capacitor DAC," IEEE, 2008, pp. 1529-1532, and information sheet (5 pages).

Kuo, Chun-Hsien, et al.: "Capacitor-Swapping Cyclic A/D Conversion Techniques With Reduced Mismatch Sensitivity," IEEE Transactions on Circuits and Systems—II: Express Briefs, vol. 55, No. 12, Dec. 2008, pp. 1219-1223, plus 2 contents pages (7 pages).

Chen, Poki: "Switching Schemes for Reducing Capacitor Mismatch Sensitivity of Quasi-Passive Cyclic DAC," IEEE Transactions on Circuits and Systems—II: Express Briefs, vol. 56, No. 1, Jan. 2009, pp. 26-30.

Kim, Hyosang, et al.: "Design of a Low Power 10-Bit Cyclic D/A Converter with a Johnson Counter and a Capacitor Swapping Technique," Proceedings from IEEE Joint Conference, Toulouse France, Jun. 28-Jul. 1, 2009 (6 pages).

Cao, Jinzhou, et al.: "Radix-Based Digital Correction Technique for Two-Capacitor DACs," 2010 IEEE International Symposium on Circuits and Systems, Nano-Bio Circuit Fabrics and Systems, May 30-Jun. 2, 2010, Paris, France, pp. 565-568, plus 1 info sheet (5 pages).

* cited by examiner

CYCLIC DIGITAL-TO-ANALOG CONVERTER (DAC) WITH CAPACITOR SWAPPING

TECHNICAL FIELD

The present invention relates to a switched capacitor cyclic digital-to-analog converter (DAC).

BACKGROUND

Reference is made to FIG. 1 which illustrates the schematic of a simplified cyclic digital-to-analog converter (DAC) 10. The DAC 10 includes a voltage source 12. A switch 14 includes a first terminal connected to the positive terminal of the voltage source 12 and a second terminal connected to the negative terminal of the voltage source 12. The switch 14 further includes a third terminal. The switch 14 operates to selectively connect either the first terminal or second terminal to the third terminal. A switch 16 includes a first terminal connected to the third terminal of switch 14 and also includes a second terminal. The switch 16 operates to selectively connect its first terminal to its second terminal. A first capacitor 18, referred to in the art as the sampling or charging capacitor, is connected between the second terminal of switch 16 and ground. A switch 20 includes a first terminal connected to the second terminal of switch 16 (as well as a first plate of the capacitor 18) and also includes a second terminal. The switch 20 operates to selectively connect its first terminal to its second terminal. A second capacitor 22, referred to in the art as the integrating or holding or sharing capacitor, is connected between the second terminal of switch 20 and ground. Output from the circuit is taken from the second terminal of the switch 20 (at the first plate of the capacitor 22).

The operation of the DAC 10 is well known to those skilled in the art. During a first phase, switch 16 is closed and switch 14 selects either the positive terminal of the voltage source 12 or the negative terminal of the voltage source 12 based on the state of a bit of a digital word to be converted. So, for example, if the bit of the digital word is "1" the switch 14 would select the positive terminal of the voltage source 12, while if the bit of the digital word is "0" the switch 14 would select the negative terminal of the voltage source 12. This effectively samples the voltage of supply 12 corresponding to "1" or "0" (for example, Vdd or ground) at the first (sampling) capacitor 18. During a second phase, switch 16 is opened and switch 20 is closed. Charge is then shared between the first (sampling) capacitor 18 and the second (holding) capacitor 22. The process then repeats for the next bit digital word to be converted. The conversion operation typically starts with the least significant bit (LSB) of the digital word to be converted and ends with the most significant bit (MSB) of the digital word to be converted. The voltage stored on the second (holding) capacitor after processing the MSB is the converted analog output from the DAC 10 corresponding to the input digital word.

The greatest source of error in the operation of the DAC 10 is mismatch between the first (sampling) capacitor 18 and the second (holding) capacitor 22. Ideally, the first (sampling) capacitor 18 and the second (holding) capacitor 22 should have identical capacitance values. However, it is very difficult to ensure identical capacitances, and where there is a mismatch in capacitance values there is a limit on the number of bits in the digital word that can be effectively and accurately converted. A need exists in the art to address the foregoing problem.

SUMMARY

In an embodiment, a cyclic digital-to-analog converter comprises: a first capacitor; a second capacitor; switching circuitry connected to the first and second capacitors, wherein the switching circuit is adapted to configure the first and second capacitors in at least a first mode where the first capacitor functions as a sampling capacitor and the second capacitor functions as a holding capacitor, and wherein the switching circuit is adapted to configure the first and second capacitors in at least a second mode where the first capacitor functions as the holding capacitor and the second capacitor functions as the sampling capacitor; and a switch control circuit coupled to the switching circuitry, the switch control circuit adapted to receive a digital word to be converted and control configuration of the switching circuit to change from the first mode to the second mode, or change from the second mode to the first mode, if adjacent bits of the digital word have different logical values and not change from the first mode or second mode if adjacent bits of the digital word have same logical values.

In an embodiment, a cyclic digital-to-analog converter comprises: a first capacitor; a second capacitor; switching circuitry selectively configurable to connect the first and second capacitors is at least two modes of operation, wherein a first mode uses the first capacitor during conversion of a bit as a sampling capacitor and uses the second capacitor during conversion of that bit as a holding capacitor, and wherein a second mode uses the second capacitor during conversion of a bit as a sampling capacitor and uses the first capacitor during conversion of that bit as a holding capacitor; and a controller adapted to swap from configuration in the first mode to configuration in the second mode for bit conversion when adjacent bits of a digital word to be converted have different logical values.

In an embodiment, a method for controlling configuration of a first capacitor and a second capacitor for use in a cyclical digital-to-analog conversion of a digital word to be converted comprises: configuring the first and second capacitors in a first mode using the first capacitor as a sampling capacitor and the second capacitor as a holding capacitor; converting one bit of the digital word using the first and second capacitors configured in the first mode; determining whether the one bit and another bit of the digital word which is adjacent the one bit have different logical values; if so, configuring the first and second capacitors in a second mode using the second capacitor as the sampling capacitor and the first capacitor as the holding capacitor; and then converting the another, adjacent, bit of the digital word using the first and second capacitors configured in the second mode.

BRIEF DESCRIPTION OF THE DRAWINGS

Reference will be made by way of example only to the accompanying drawings in which.

DETAILED DESCRIPTION OF THE DRAWINGS

Figure 2:
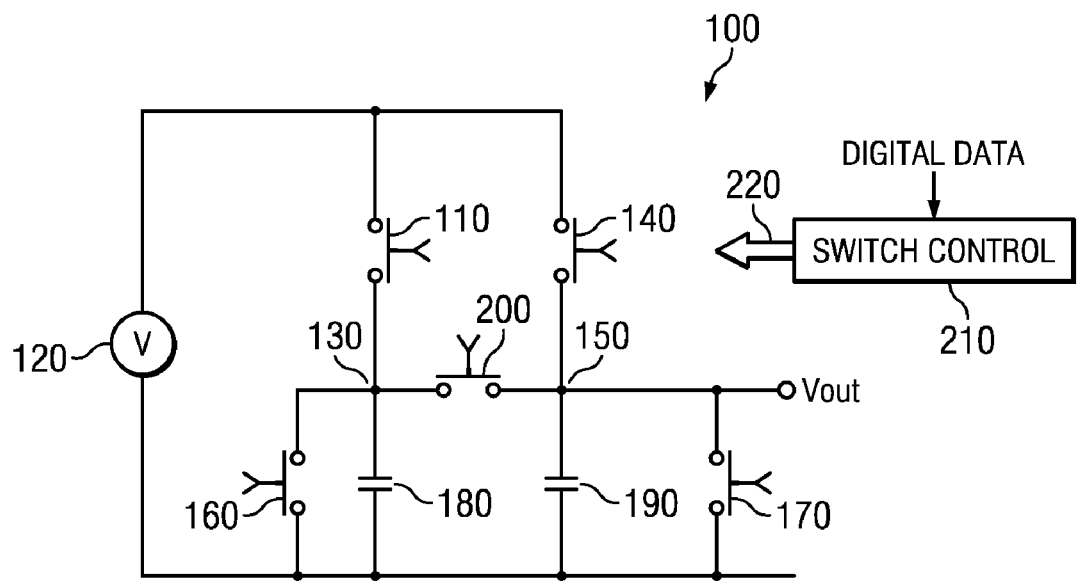
FIG. 2 is a schematic of a simplified cyclic digital-to-analog converter (DAC) that supports capacitor swapping.

Reference is now made to FIG. 2 which shows a schematic of a simplified cyclic digital-to-analog converter (DAC) 100 that supports capacitor swapping. The DAC 100 includes a voltage source 120. A switch 110 includes a first terminal connected to the positive terminal of the voltage source 120 and a second terminal connected to node 130. A switch 140 includes a first terminal connected to the positive terminal of the voltage source 120 and a second terminal connected to node 150. A switch 160 includes a first terminal connected to the node 130 and a second terminal connected to the negative terminal of the voltage source 120. A switch 170 includes a first terminal connected to the node 150 and a second terminal connected to the negative terminal of the voltage source 120. A first capacitor 180 is connected between the node 130 and the negative terminal of the voltage source 12. A second capacitor 190 is connected between the node 130 and the negative terminal of the voltage source 12. A switch 200 includes a first terminal connected to the node 130 and a second terminal connected to the node 150.

A switch control circuit 210 generates switch control signals 220 for application to control actuation of the switches 110, 140, 160, 170 and 200. The switch control circuit 210 receives the digital data to be converted, and the controlled actuation of the switches 110, 140, 160, 170 and 200 is made in response to that digital data.

Figure 1:
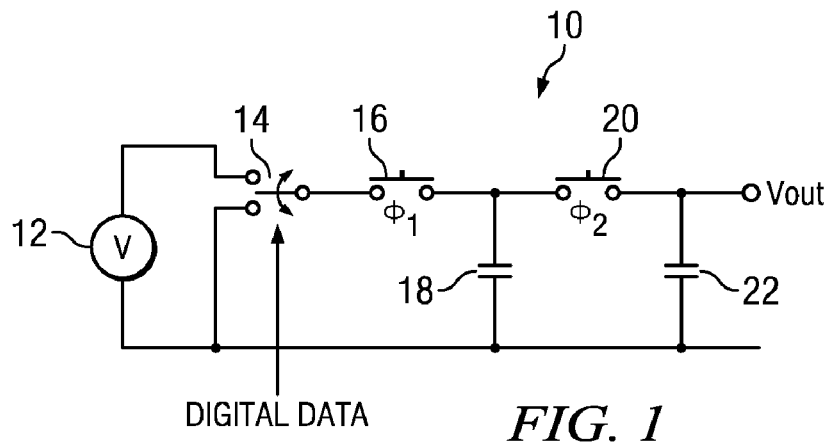
FIG. 1 is a schematic of a simplified cyclic digital-to-analog converter (DAC) in accordance with the prior art.

Although the DAC 100 includes a first capacitor 180 and a second capacitor 190, these capacitors do not have fixed sampling and holding functional responsibilities as with the DAC 10 of FIG. 1. Rather, the sampling and holding functional responsibilities are swapped (or exchanged) between the first capacitor 180 and second capacitor 190 in response to the digital data to be converted. The DAC 100 accordingly may then be generally described as being operable in two modes based on the functional responsibilities of the first capacitor 180 and second capacitor 190.

A first mode of operation, referred to herein as MODE A, has the DAC 100 configured with first capacitor 180 as the "sampling" capacitor and the second capacitor 190 as the "holding" capacitor. In MODE A, switches 110 and 160 are controlled during a first phase to connect node 130 to either the positive terminal of the voltage source 120 or the negative terminal of the voltage source 120 based on the state of a bit of a digital word to be converted. So, for example, if the bit of the digital word is "1" the switch 110 would be closed and the switch 160 would be opened, while if the bit of the digital word is "0" the switch 110 would be opened and the switch 160 would be closed. This effectively samples the voltage corresponding to "1" or "0" (for example, Vdd and ground) at the first capacitor 180 (operating as the "sampling" capacitor). Furthermore, by opening switch 140 and closing switch 170 during this first phase, the second capacitor 190 is reset. During a second phase, switches 110 and 160 are opened and switch 200 is closed. Charge is then shared between the first (sampling) capacitor 180 and the second capacitor 190 (operating as the "holding" capacitor).

The foregoing description of MODE A operation is exemplary in nature only and specific to the circuit implementation of FIG. 2. In a more general sense, MODE A will be understood to mean, in the context of any cyclic DAC circuit including two capacitors used for sampling and holding, and wherein DAC supports swapping the sampling and holding function between the two capacitors, the use of a first one of the two capacitors as the sampling capacitor and the use of the second one of the two capacitors as the holding capacitor.

A second mode, referred to herein as MODE B, has the DAC 100 configured with second capacitor 190 as the "sampling" capacitor and the first capacitor 180 as the "holding" capacitor. In MODE B, switches 140 and 170 are controlled during a first phase to connect node 150 to either the positive terminal of the voltage source 120 or the negative terminal of the voltage source 120 based on the state of a bit of a digital word to be converted. So, for example, if the bit of the digital word is "1" the switch 140 would be closed and the switch 170 would be opened, while if the bit of the digital word is "0" the switch 140 would be opened and the switch 170 would be closed. This effectively samples the voltage corresponding to "1" or "0" (for example, Vdd and ground) at the second capacitor 190 (operating as the "sampling" capacitor). Furthermore, by opening switch 110 and closing switch 160 during this first phase, the first capacitor 180 is reset. During a second phase, switches 140 and 170 are opened and switch 200 is closed. Charge is then shared between the second (sampling) capacitor 190 and the first capacitor 180 (operating as the "holding" capacitor).

The foregoing description of MODE B operation is exemplary in nature only and specific to the circuit implementation of FIG. 2. In a more general sense, MODE B will be understood to mean, in the context of any cyclic DAC circuit including two capacitors used for sampling and holding, and wherein DAC supports swapping the sampling and holding function between the two capacitors, the use of a second one of the two capacitors as the sampling capacitor and the use of the first one of the two capacitors as the holding capacitor.

Figure 3:
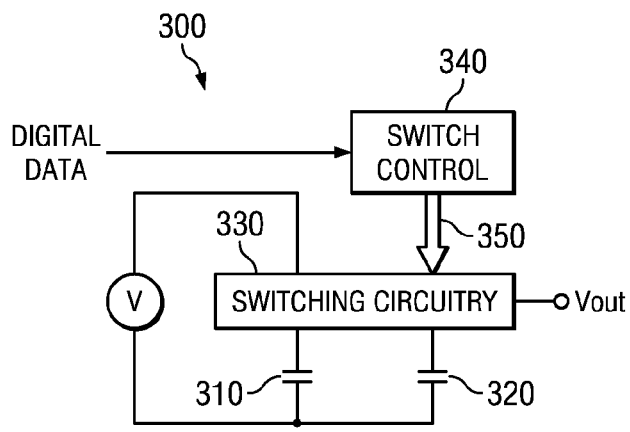
FIG. 3 is a block diagram of a cyclic digital-to-analog converter (DAC) that supports capacitor swapping.

The circuit of FIG. 2 may thus be illustrated more generally in block diagram format as shown in FIG. 3. The cyclic DAC 300 of FIG. 3 includes a first capacitor 310 and second capacitor 320. The DAC 300 further includes switching circuitry 330 that is selectively controllable to connect the first capacitor 310 and the second capacitor 320 in two sampling/holding configurations. A first sampling/holding configuration, also referred to herein as MODE A, utilizes the first capacitor 310 as the sampling capacitor for cyclic DAC operation and utilizes the second capacitor 320 as the holding capacitor for cyclic DAC operation. A second sampling/holding configuration, also referred to herein as MODE B, utilizes the first capacitor 310 as the holding capacitor for cyclic DAC operation and utilizes the second capacitor 320 as the sampling capacitor for cyclic DAC operation. The cyclic DAC 300 still further includes a switch control circuit 340 which generates switch control signals 350 for application to control actuation of the switching circuitry 330. The switch control circuit 340 receives the digital data to be converted, and the controlled actuation of the switching circuitry 330 is made in response to that digital data to switch between the first sampling/holding configuration (MODE A) and the second sampling/holding configuration (MODE B) based upon the digital data to be converted.

A number of capacitor swapping techniques for cyclic DAC operation are known in the art. For example, Chen "Switching Schemes for Reducing Capacitor Mismatch Sensitivity of Quasi-Passive Cyclic DAC," IEEE Trans. on Circuits and Systems—II, Express Briefs, Vo. 56, No. 1, January 2009 (the disclosure of which is hereby incorporated by reference) teaches converting each word twice, once with the first capacitor as the sampling capacitor and the second capacitor as the holding capacitor, and then again with the second capacitor as the sampling capacitor and the first capacitor as the holding capacitor. The analog outputs of the two conversions are then averaged together to provide an analog output corresponding to the digital input.

In another example, Kim "Design of a Low Power 10-bit Cycle D/A Converter with a Johnson Counter and a Capacitor Swapping Technique," 2009 Joint IEEE North-East Workshop on Circuits and Systems and TAISA Conference, June 2009 (the disclosure of which is hereby incorporated by reference) teaches alternating bit-by-bit which capacitor functions as the sampling capacitor and which capacitor functions as the holding capacitor. Thus, for example, even bits of the word will use the first capacitor as the sampling capacitor and the second capacitor as the holding capacitor, while odd bits of the word will use the second capacitor as the sampling capacitor and the first capacitor as the holding capacitor.

Still further, Bell U.S. Pat. No. 7,355,582 (the disclosure of which is hereby incorporated by reference) teaches a "frame swapping" technique and a "cycle swapping" technique where the roles of the two capacitors switched based on frame number or alternating cycles to address the error arising from capacitor mismatch.

Lastly, Wu U.S. Pat. No. 7,425,913 (the disclosure of which is hereby incorporated by reference) teaches a technique for swapping the sampling and holding function between the two capacitors in a cyclic DAC based upon the bits of the digital word to be converted. More specifically, Wu teaches using the logic value of the LSB of the digital word to initially select the sampling and holding functional assignments of the two capacitors. The individual bits of the digital word are then serially processed, and the sampling and holding functional assignments of the two capacitors are swapped for the next bit only if that next bit and the adjacent previous bit have the same logic value.

While the foregoing swapping techniques provide some improvement in addressing nonlinearities due to capacitor mismatch in two capacitor cyclic DAC circuits, there is still room for improvement. The switch control circuit 210 of FIG. 2 and switch control circuit 340 of FIG. 3 implement a process as described below for controlling capacitor swapping to provide for an improved digital to analog conversion.

Figure 4:
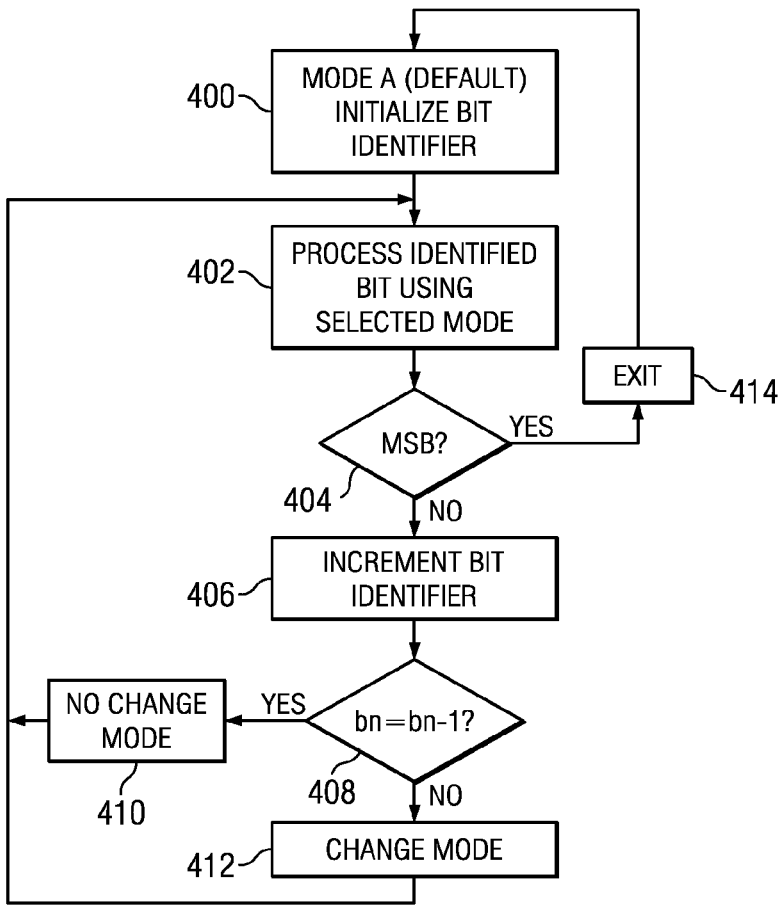
FIG. 4 is a flow diagram of a control process for improved digital to analog conversion using a cyclic DAC circuit supporting capacitor swapping (such as in FIGS. 2 and 3)

Reference is now made to FIG. 4 which shows a flow diagram of a control process for improved digital to analog conversion using a cyclic DAC circuit supporting capacitor swapping (such as in FIGS. 2 and 3). MODE A is selected 400 as a default configuration for the cyclic DAC circuit, and a bit identifier (bn) is set to a first bit (i.e., the LSB) of the digital word to be converted. The identified bit of the digital word is then processed 402 with the cyclic DAC circuit in the selected configuration (at this point, the MODE A configuration). The bit identifier is then incremented 406. A determination is then made in step 408 as to whether the identified bit (the next bit following incrementing of the bit identifier) and the previously processed (i.e., the immediately preceding adjacent) bit in the digital word to be converted have the same logic value (i.e., is bn=bn−1?). If YES, then no change 410 is made in the selected configuration for the cyclic DAC circuit (for example, MODE A remains selected). The process then returns to step 402 where the identified bit of the digital word is processed 402 with the cyclic DAC circuit in the selected configuration. If NO, then a change 412 is made in the selected configuration for the cyclic DAC circuit (for example, MODE B is selected). The process then returns to step 402 where the identified bit of the digital word is processed 402 with the cyclic DAC circuit in the selected configuration. The process continues to loop handling the digital word to be converted on a bit-by-bit basis until it is determined at step 404 that the bit identifier is set to a last bit (i.e., the MSB) of the digital word to be converted. At that point, the loop is exited 414 and the process returns to step 400 to handle a next digital word to be converted.

Operation of the process may be better understood with reference to an example. Consider a digital word to be converted of 1011 (in MSB, LSB2, LSB1, LSB0 format). In step 400 MODE A is selected as the default configuration. The LSB0=1 bit is then processed 402 by the cyclic DAC circuit with the first one of the two capacitors as the sampling capacitor and the second one of the two capacitors as the holding capacitor. The next bit LSB1=1 is then compared to the immediately preceding bit LSB0=1 in step 408. Because the two bits have the same value, no change 410 is made in the selected configuration for the cyclic DAC circuit (MODE A remains selected). The LSB1=1 bit is then processed 402 by the cyclic DAC circuit with the first one of the two capacitors as the sampling capacitor and the second one of the two capacitors as the holding capacitor. The next bit LSB2=0 is then compared to the immediately preceding bit LSB1=1 in step 408. Because the two bits have different values, a change 412 is made in the selected configuration for the cyclic DAC circuit (MODE B is selected). The LSB2=0 bit is then processed 402 by the cyclic DAC circuit with the first one of the two capacitors as the holding capacitor and the second one of the two capacitors as the sampling capacitor. The next bit MSB=1 is then compared to the immediately preceding bit LSB2=0 in step 408. Because the two bits have different values, a change 412 is made in the selected configuration for the cyclic DAC circuit (MODE A is selected). The MSB=1 bit is then processed 402 by the cyclic DAC circuit with the first one of the two capacitors as the sampling capacitor and the second one of the two capacitors as the holding capacitor. Step 404 then determines that the last bit (i.e., the MSB) of the digital word has been processed, and the process returns to step 400 to handle a next digital word to be converted.

A further understanding of the process of FIG. 4 may obtained by reference to the following Table which illustrates, for all possibilities of a 4-bit digital word to be converted, the controlled mode selection for operation of the cyclic DAC circuit supporting capacitor swapping. In the Table, the left side presents all 4-bit words and the right side presents the sequence of mode selections in processing the corresponding 4-bit word through the cyclic DAC circuit supporting capacitor swapping in accordance with the process of FIG. 4.

| MSB | LSB2 | LSB1 | LSB0 | LSB0 | LSB1 | LSB2 | MSB |
|---|---|---|---|---|---|---|---|
| 0 | 0 | 0 | 0 | A | A | A | A |
| 0 | 0 | 0 | 1 | A | B | B | B |
| 0 | 0 | 1 | 0 | A | B | A | A |
| 0 | 0 | 1 | 1 | A | A | B | B |
| 0 | 1 | 0 | 0 | A | A | B | A |

-continued

| MSB | LSB2 | LSB1 | LSB0 | LSB0 | LSB1 | LSB2 | MSB |
|---|---|---|---|---|---|---|---|
| 0 | 1 | 0 | 1 | A | B | A | B |
| 0 | 1 | 1 | 0 | A | B | B | A |
| 0 | 1 | 1 | 1 | A | A | A | B |
| 1 | 0 | 0 | 0 | A | A | A | B |
| 1 | 0 | 0 | 1 | A | B | B | A |
| 1 | 0 | 1 | 0 | A | B | A | B |
| 1 | 0 | 1 | 1 | A | A | B | A |
| 1 | 1 | 0 | 0 | A | A | B | B |
| 1 | 1 | 0 | 1 | A | B | A | A |
| 1 | 1 | 1 | 0 | A | B | B | B |
| 1 | 1 | 1 | 1 | A | A | A | A |

Figure 5:
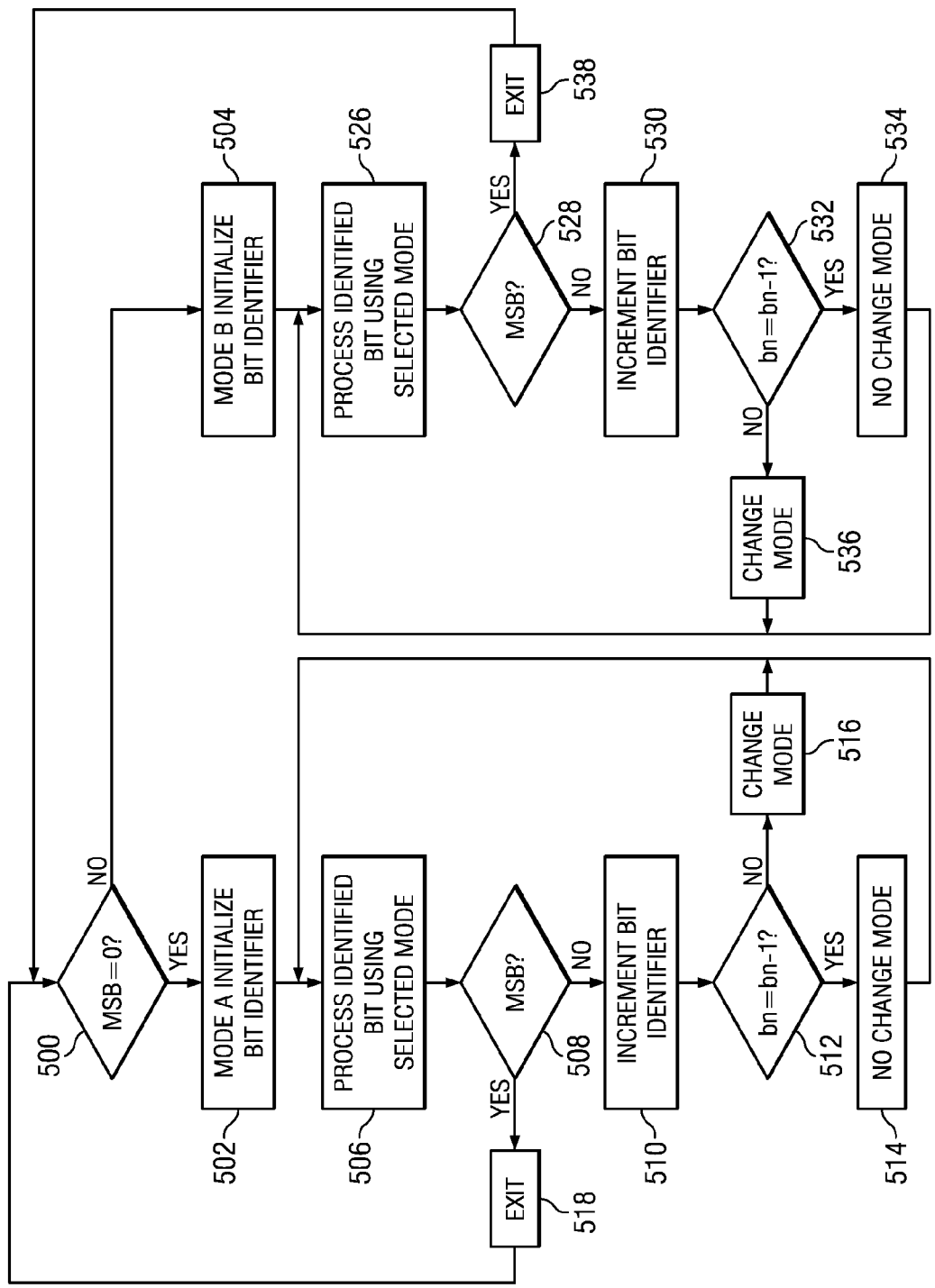
FIG. 5 is a flow diagram of a control process for improved digital to analog conversion using a cyclic DAC circuit supporting capacitor swapping (such as in FIGS. 2 and 3)

Reference is now made to FIG. 5 which shows a flow diagram of a control process for improved digital to analog conversion using a cyclic DAC circuit supporting capacitor swapping (such as in FIGS. 2 and 3). The last bit (i.e., the MSB) of the digital word to be converted is evaluated 500 in order to select an initial configuration for the cyclic DAC circuit. If the MSB=0, then MODE A is selected 502 as the initial configuration for the cyclic DAC circuit, and a bit identifier is set to a first bit (i.e., the LSB) of the digital word to be converted. Conversely, if the MSB=1, then MODE B is selected 504 as the initial configuration for the cyclic DAC circuit, and a bit identifier is set to a first bit (i.e., the LSB) of the digital word to be converted.

Where MSB=0 and a selection 502 is made of MODE A as the initial configuration, the identified bit of the digital word is then processed 506 with the cyclic DAC circuit in the selected configuration (at this point, the MODE A configuration). The bit identifier is then incremented 510. A determination is then made in step 512 as to whether the identified bit (the next bit following incrementing of the bit identifier) and the previously processed (i.e., the immediately preceding adjacent) bit in the digital word to be converted have the same logic value (i.e., is bn=bn−1?). If YES, then no change 514 is made in the selected configuration for the cyclic DAC circuit (for example, MODE A remains selected). The process then returns to step 506 where the identified bit of the digital word is processed 506 with the cyclic DAC circuit in the selected configuration. If NO, then a change 516 is made in the selected configuration for the cyclic DAC circuit (for example, MODE B is selected). The process then returns to step 506 where the identified bit of the digital word is processed 506 with the cyclic DAC circuit in the selected configuration. The process continues to loop handling the digital word to be converted on a bit-by-bit basis until it is determined at step 508 that the bit identifier is set to a last bit (i.e., the MSB) of the digital word to be converted. At that point, the loop is exited 518 and the process returns to step 500 to handle a next digital word to be converted.

Where MSB=1 and a selection 504 is made of MODE B as the initial configuration, the identified bit of the digital word is then processed 526 with the cyclic DAC circuit in the selected configuration (at this point, the MODE B configuration). The bit identifier is then incremented 530. A determination is then made in step 532 as to whether the identified bit (the next bit following incrementing of the bit identifier) and the previously processed (i.e., the immediately preceding adjacent) bit in the digital word to be converted have the same logic value. If YES, then no change 534 is made in the selected configuration for the cyclic DAC circuit (for example, MODE B remains selected). The process then returns to step 526 where the identified bit of the digital word is processed 526 with the cyclic DAC circuit in the selected configuration. If NO, then a change 536 is made in the selected configuration for the cyclic DAC circuit (for example, MODE A is selected). The process then returns to step 526 where the identified bit of the digital word is processed 526 with the cyclic DAC circuit in the selected configuration. The process continues to loop handling the digital word to be converted on a bit-by-bit basis until it is determined at step 528 that the bit identifier is set to a last bit (i.e., the MSB) of the digital word to be converted. At that point, the loop is exited 538 and the process returns to step 500 to handle a next digital word to be converted.

Operation of the process may be better understood with reference to an example. Consider a digital word to be converted of 0011 (MSB, LSB2, LSB1, LSB0 format). In step 500 the MSB bit is evaluated 500 in order to select an initial configuration for the cyclic DAC circuit. Since MSB=0, MODE A is selected 502 as the initial configuration for the cyclic DAC circuit. The LSB0=1 bit is then processed 506 by the cyclic DAC circuit with the first one of the two capacitors as the sampling capacitor and the second one of the two capacitors as the holding capacitor. The next bit LSB1=1 is then compared to the immediately preceding bit LSB0=1 in step 512. Because the two bits have the same value, no change 514 is made in the selected configuration for the cyclic DAC circuit (MODE A remains selected). The LSB1=1 bit is then processed 506 by the cyclic DAC circuit with the first one of the two capacitors as the sampling capacitor and the second one of the two capacitors as the holding capacitor. The next bit LSB2=0 is then compared to the immediately preceding bit LSB1=1 in step 512. Because the two bits have different values, a change 516 is made in the selected configuration for the cyclic DAC circuit (MODE B is selected). The LSB2=0 bit is then processed 506 by the cyclic DAC circuit with the first one of the two capacitors as the holding capacitor and the second one of the two capacitors as the sampling capacitor. The next bit MSB=0 is then compared to the immediately preceding bit LSB2=0 in step 512. Because the two bits have the same value, no change 514 is made in the selected configuration for the cyclic DAC circuit (MODE B is selected). The MSB=0 bit is then processed 506 by the cyclic DAC circuit with the first one of the two capacitors as the holding capacitor and the second one of the two capacitors as the sampling capacitor. Step 508 then determines that the last bit (i.e., the MSB) of the digital word has been processed, and the process returns to step 500 to handle a next digital word to be converted.

In another example, consider a digital word to be converted of 1011 (MSB, LSB2, LSB1, LSB0 format). In step 500 the MSB bit is evaluated 500 in order to select an initial configuration for the cyclic DAC circuit. Since MSB=1, MODE B is selected 502 as the initial configuration for the cyclic DAC circuit. The LSB0=1 bit is then processed 526 by the cyclic DAC circuit with the first one of the two capacitors as the holding capacitor and the second one of the two capacitors as the sampling capacitor. The next bit LSB1=1 is then compared to the immediately preceding bit LSB0=1 in step 532. Because the two bits have the same value, no change 534 is made in the selected configuration for the cyclic DAC circuit (MODE B remains selected). The LSB1=1 bit is then processed 506 by the cyclic DAC circuit with the first one of the two capacitors as the holding capacitor and the second one of the two capacitors as the sampling capacitor. The next bit LSB2=0 is then compared to the immediately preceding bit LSB1=1 in step 532. Because the two bits have different values, a change 536 is made in the selected configuration for the cyclic DAC circuit (MODE A is selected). The LSB2=0 bit is then processed 526 by the cyclic DAC circuit with the first one of the two capacitors as the sampling capacitor and the second one of the two capacitors as the holding capacitor. The next bit MSB=1 is then compared to the immediately preceding bit LSB2=0 in step 532. Because the two bits have different values, a change 536 is made in the selected configuration for the cyclic DAC circuit (MODE B is selected). The MSB=1 bit is then processed 526 by the cyclic DAC circuit with the first one of the two capacitors as the holding capacitor and the second one of the two capacitors as the sampling capacitor. Step 528 then determines that the last bit (i.e., the MSB) of the digital word has been processed, and the process returns to step 500 to handle a next digital word to be converted.

A further understanding of the process of FIG. 5 may obtained by reference to the following Table which illustrates, for all possibilities of a 4-bit digital word, the controlled mode selection for operation of the cyclic DAC circuit supporting capacitor swapping. In the Table, the left side presents all 4-bit words and the right side presents the sequence of mode selections in processing the corresponding 4-bit word through the cyclic DAC circuit supporting capacitor swapping using the process of FIG. 5.

| MSB | LSB2 | LSB1 | LSB0 | LSB0 | LSB1 | LSB2 | MSB |
|---|---|---|---|---|---|---|---|
| 0 | 0 | 0 | 0 | A | A | A | A |
| 0 | 0 | 0 | 1 | A | B | B | B |
| 0 | 0 | 1 | 0 | A | B | A | A |
| 0 | 0 | 1 | 1 | A | A | B | B |
| 0 | 1 | 0 | 0 | A | A | B | A |
| 0 | 1 | 0 | 1 | A | B | A | B |
| 0 | 1 | 1 | 0 | A | B | B | A |
| 0 | 1 | 1 | 1 | A | A | A | B |
| 1 | 0 | 0 | 0 | B | B | B | A |
| 1 | 0 | 0 | 1 | B | A | A | B |
| 1 | 0 | 1 | 0 | B | A | B | A |
| 1 | 0 | 1 | 1 | B | B | A | B |
| 1 | 1 | 0 | 0 | B | B | A | A |
| 1 | 1 | 0 | 1 | B | A | B | B |
| 1 | 1 | 1 | 0 | B | A | A | A |
| 1 | 1 | 1 | 1 | B | B | B | B |

Figure 6:
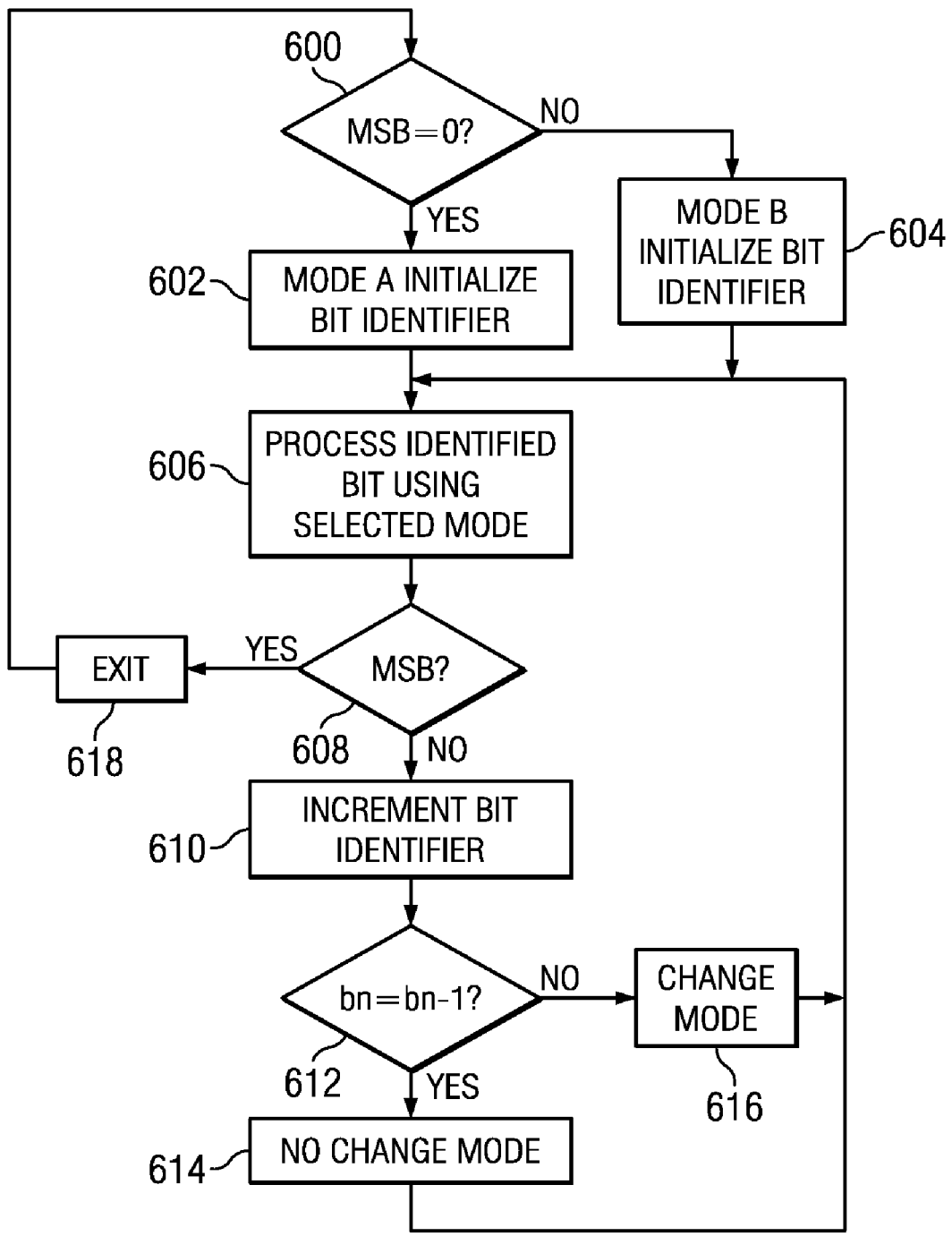
FIG. 6 is an alternative presentation of the FIG. 5 flow diagram

The FIG. 5 flow diagram of the control process for improved digital to analog conversion using a cyclic DAC circuit supporting capacitor swapping may alternatively be presented as shown in FIG. 6. The last bit (i.e., the MSB) of the digital word to be converted is evaluated 600 in order to select a default configuration for the cyclic DAC circuit. If the MSB=0, then MODE A is selected 602 as the default configuration for the cyclic DAC circuit, and a bit identifier is set to a first bit (i.e., the LSB) of the digital word to be converted. Conversely, if the MSB=1, then MODE B is selected 604 as the default configuration for the cyclic DAC circuit, and a bit identifier is set to a first bit (i.e., the LSB) of the digital word to be converted.

The identified bit of the digital word is then processed 606 with the cyclic DAC circuit in the selected configuration (at this point, the selected default configuration). The bit identifier is then incremented 610. A determination is then made in step 612 as to whether the identified bit (the next bit following incrementing of the bit identifier) and the previously processed (i.e., the immediately preceding adjacent) bit in the digital word to be converted have the same logic value. If YES, then no change 614 is made in the selected configuration for the cyclic DAC circuit (for example, the selected default remains selected). The process then returns to step 606 where the identified bit of the digital word is processed 606 with the cyclic DAC circuit in the selected configuration. If NO, then a change 616 is made in the selected configuration for the cyclic DAC circuit (for example, mode other than the selected default is selected). The process then returns to step 606 where the identified bit of the digital word is processed 606 with the cyclic DAC circuit in the selected configuration. The process continues to loop handling the digital word to be converted on a bit-by-bit basis until it is determined at step 608 that the bit identifier is set to a last bit (i.e., the MSB) of the digital word to be converted. At that point, the loop is exited 618 and the process returns to step 600 to handle a next digital word to be converted.

Operation of the process may be better understood with reference to an example. Consider a digital word to be converted of 0011 (MSB, LSB2, LSB1, LSB0 format). In step 600 the MSB bit is evaluated 600 in order to select a default configuration for the cyclic DAC circuit. Since MSB=0, MODE A is selected 602 as the default configuration for the cyclic DAC circuit. The LSB0=1 bit is then processed 606 by the cyclic DAC circuit with the first one of the two capacitors as the sampling capacitor and the second one of the two capacitors as the holding capacitor. The next bit LSB1=1 is then compared to the immediately preceding bit LSB0=1 in step 612. Because the two bits have the same value, no change 614 is made in the selected configuration for the cyclic DAC circuit (default MODE A remains selected). The LSB1=1 bit is then processed 606 by the cyclic DAC circuit with the first one of the two capacitors as the sampling capacitor and the second one of the two capacitors as the holding capacitor. The next bit LSB2=0 is then compared to the immediately preceding bit LSB1=1 in step 612. Because the two bits have different values, a change 616 is made in the selected configuration for the cyclic DAC circuit (the non-default MODE B is selected). The LSB2=0 bit is then processed 606 by the cyclic DAC circuit with the first one of the two capacitors as the holding capacitor and the second one of the two capacitors as the sampling capacitor. The next bit MSB=0 is then compared to the immediately preceding bit LSB2=0 in step 612. Because the two bits have the same value, no change 614 is made in the selected configuration for the cyclic DAC circuit (the non-default MODE B is selected). The MSB=0 bit is then processed 606 by the cyclic DAC circuit with the first one of the two capacitors as the holding capacitor and the second one of the two capacitors as the sampling capacitor. Step 608 then determines that the last bit (i.e., the MSB) of the digital word has been processed, and the process returns to step 600 to handle a next digital word to be converted.

In another example, consider a digital word to be converted of 1011 (MSB, LSB2, LSB1, LSB0 format). In step 600 the MSB bit is evaluated 600 in order to select a default configuration for the cyclic DAC circuit. Since MSB=1, MODE B is selected 602 as the default configuration for the cyclic DAC circuit. The LSB0=1 bit is then processed 606 by the cyclic DAC circuit with the first one of the two capacitors as the holding capacitor and the second one of the two capacitors as the sampling capacitor. The next bit LSB1=1 is then compared to the immediately preceding bit LSB0=1 in step 612. Because the two bits have the same value, no change 614 is made in the selected configuration for the cyclic DAC circuit (default MODE B remains selected). The LSB1=1 bit is then processed 606 by the cyclic DAC circuit with the first one of the two capacitors as the holding capacitor and the second one of the two capacitors as the sampling capacitor. The next bit LSB2=0 is then compared to the immediately preceding bit LSB1=1 in step 612. Because the two bits have different values, a change 616 is made in the selected configuration for the cyclic DAC circuit (the non-default MODE A is selected). The LSB2=0 bit is then processed 606 by the cyclic DAC circuit with the first one of the two capacitors as the sampling capacitor and the second one of the two capacitors as the holding capacitor. The next bit MSB=1 is then compared to the immediately preceding bit LSB2=0 in step 612. Because the two bits have different values, a change 616 is made in the selected configuration for the cyclic DAC circuit (the default MODE B is selected). The MSB=1 bit is then processed 606 by the cyclic DAC circuit with the first one of the two capacitors as the holding capacitor and the second one of the two capacitors as the sampling capacitor. Step 608 then determines that the last bit (i.e., the MSB) of the digital word has been processed, and the process returns to step 600 to handle a next digital word to be converted.

A further understanding of the process of FIG. 6 may obtained by reference to the following Table which illustrates, for all possibilities of a 4-bit digital word, the controlled mode selection for operation of the cyclic DAC circuit supporting capacitor swapping. In the Table, the left side presents all 4-bit words and the right side presents the sequence of mode selections in processing the corresponding 4-bit word through the cyclic DAC circuit supporting capacitor swapping using the process of FIG. 6.

Figure 7:
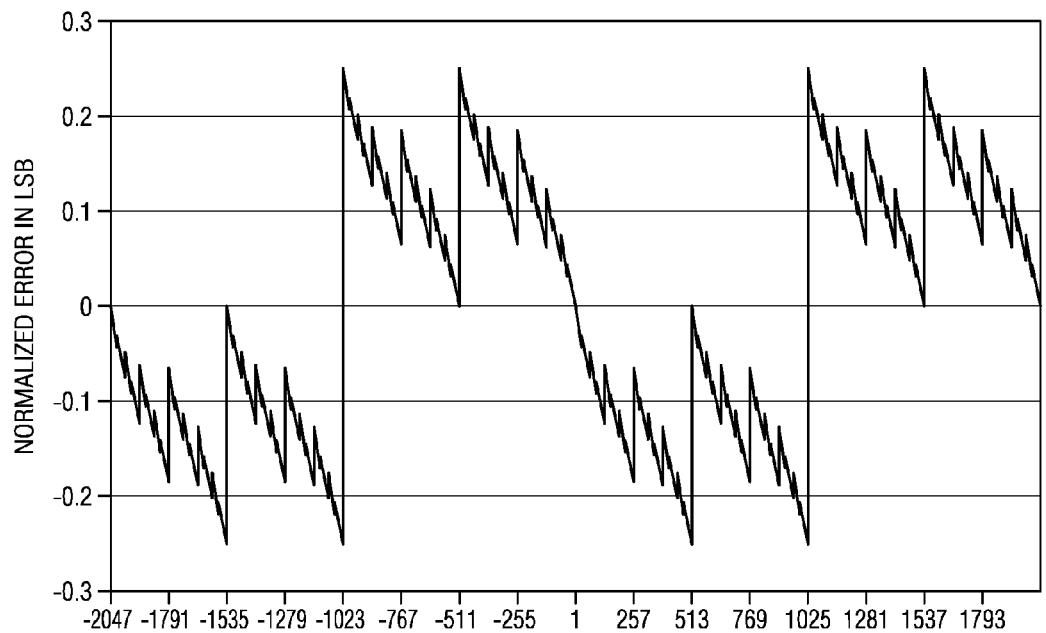
FIG. 7 graphs a measurement of absolute error for a cyclic DAC operating without capacitor swapping.
Figure 8:
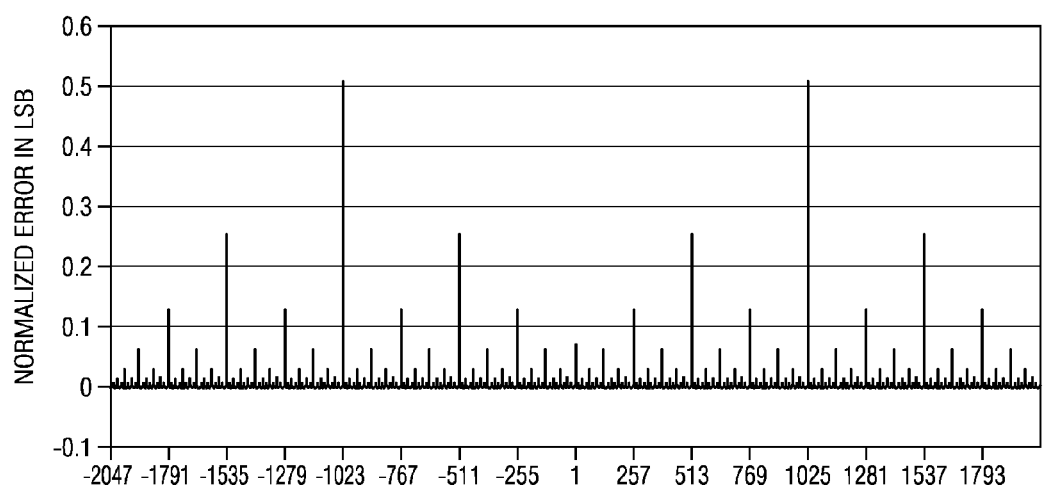
FIG. 8, graphs a measurement of error in dynamic non-linearity (DNL) for a cyclic DAC operating without capacitor swapping.
Figure 9:
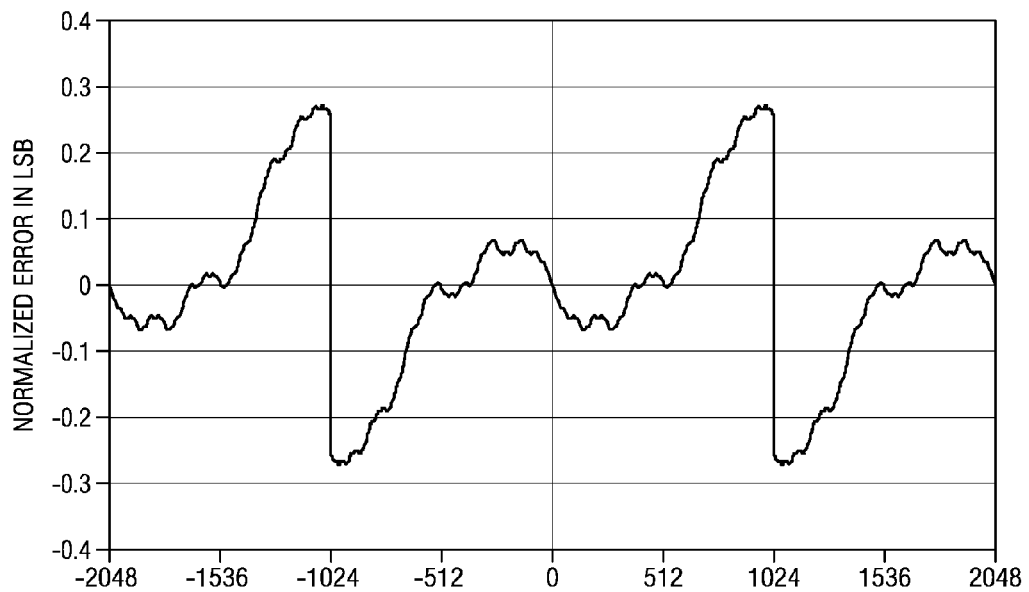
FIG. 9 graphs a measurement of absolute error for a cyclic DAC operating with capacitor swapping in accordance with the process of FIG. 4.
Figure 10:
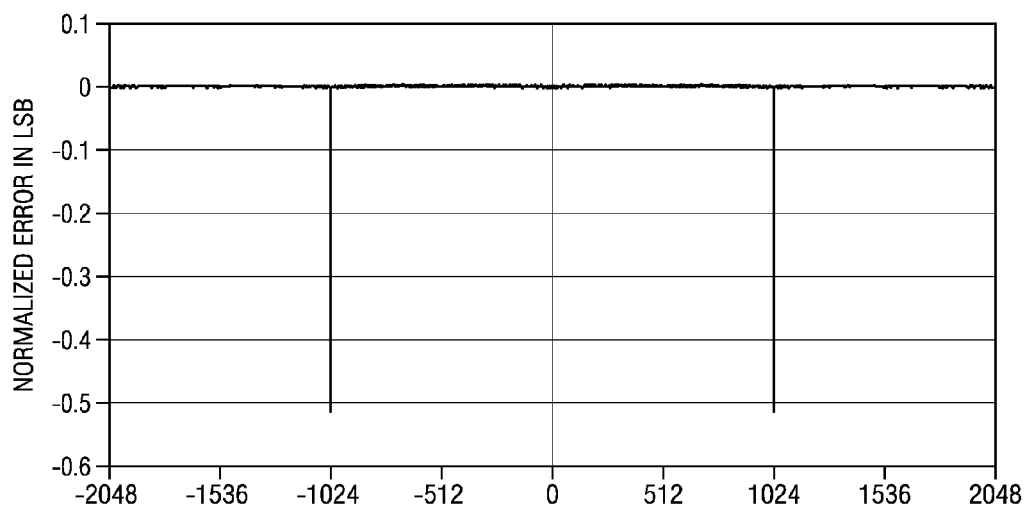
FIG. 10 graphs a measurement of error in dynamic non-linearity (DNL) for a cyclic DAC operating with capacitor swapping in accordance with the process of FIG. 4.

| MSB | LSB2 | LSB1 | LSB0 | LSB0 | LSB1 | LSB2 | MSB |
|---|---|---|---|---|---|---|---|
| 0 | 0 | 0 | 0 | A | A | A | A |
| 0 | 0 | 0 | 1 | A | B | B | B |
| 0 | 0 | 1 | 0 | A | B | A | A |
| 0 | 0 | 1 | 1 | A | A | B | B |
| 0 | 1 | 0 | 0 | A | A | B | A |
| 0 | 1 | 0 | 1 | A | B | A | B |
| 0 | 1 | 1 | 0 | A | B | B | A |
| 0 | 1 | 1 | 1 | A | A | A | B |
| 1 | 0 | 0 | 0 | B | B | B | A |
| 1 | 0 | 0 | 1 | B | A | A | B |
| 1 | 0 | 1 | 0 | B | A | B | A |
| 1 | 0 | 1 | 1 | B | B | A | B |
| 1 | 1 | 0 | 0 | B | B | A | A |
| 1 | 1 | 0 | 1 | B | A | B | B |
| 1 | 1 | 1 | 0 | B | A | A | A |
| 1 | 1 | 1 | 1 | B | B | B | B |

Where the first and second capacitors of the cyclic DAC are not matched, and the DAC is operable in a non-swapping mode, it is observed that there is a sharp change of error when value code increase to the next MSB level. The absolute error, $e_I$ can be approximated with:

$$e_I \approx V_{ref} \cdot e_c \cdot \sum_{n=0}^{N-1}\left[\left(1 - \frac{1}{2}\cdot(N-n)\right)\cdot \frac{b_n}{2^{N-n}}\right]$$

where $Cy=Cx+\Delta C$, and $e_C=\Delta C/C$. This equation was applied to the operation of an N bit un-signed cyclical DAC, but would be perfectly applicable as well to an N+1 bit signed cyclical DAC. All possible signed 12-bit digital words were applied to the foregoing error equation to obtain a measurement of absolute error as function of the signed 12-bit digital word. The results are graphed in FIG. 7 (normalized to the LSB). FIG. 8 is a corresponding graphic presentation of the error in dynamic non-linearity (DNL). Note should be made of the significant errors at each instance where the code value increases to the next MSB level.

Where the first and second capacitors of the cyclic DAC are not matched, and the DAC is operable in both MODE A and MODE B, it will be understood that capacitor mismatch in the MODE A configuration will produce negative error while capacitor mismatch in the MODE B configuration will produce positive error. The process of FIG. 4 was simulated for all possible signed 12-bit digital words and a measurement was made of absolute error as function of the signed 12-bit digital word. FIG. 9 is a graphic presentation of the measured absolute error. It is noted that the error does not change much (approximately ±0.25 LSB) over the extent of the signed 12-bit digital words.

The following presents an explanation of DNL improvement by swapping capacitor functions based on the bits of the digital word when the current bit is different from the previous bit as shown in FIGS. 4, 5 and 6. As shown in FIGS. 7 and 8, when using conventional cyclic DAC operations without capacitor swapping the worst DNL occurs (for signed 12-bit digital words) in the case of 1024/1023 transition and that the next worst DNL occurs for 512/511 and 1535/1536 transitions, but more generally error is associated with instance where the code value increases to the next MSB level. Taking specifically the +512/+511 transition as an example, where +512 is [01000000000] and +511 is [00111111111], a sufficient condition to make sure that the results of conversions of +512 and +511 are very close to each other (to ensure a small DNL), is to ensure that the result of conversion of 1000000000 (subset of 01000000000) and the result of the conversion of 0111111111 (subset of 00111111111) are close to each other. The conversion for +511 is: $V_{511-10}=V_{511-9}/2^*(1-e_C/2)+0$, and the conversion for +512 is: $V_{512-10}=V_{512-9}/2^*(1-e_C/2)+0$. As the conversions for $V_{51x-9}$ are assumed previously to be very close to each other, the same will be true for the conversions for $V_{51x-10}$.

The foregoing indicates that DNL can be reduced for the +512/+511 conversion by swapping the capacitor functions when the current bit being converted is different from the previous bit. By recurrence, it is possible to show that the foregoing swapping rule assists in reducing DNL for every bit until the LSB. The improvement in DNL is shown by comparing FIGS. 9 and 10 to FIGS. 7 and 8.

With reference to FIGS. 7 and 9, it will be noted that a sharp change in error exists with respect to each MSB transition (i.e., the MSB in the digital word transitioning from "0" to "1" or vice versa). The foregoing is explained by further examining the conversion error at the MSB boundary. Using the process of FIG. 4, it will be noted that the input digital word for code −1023 [01111111111] (in MSB to LSB format) is converted with the MODE pattern of AAAAAAAAAAB (from LSB to MSB). In this case, the MODE A cycles that are operating to convert a "1" in the word will produce a cumulative negative error. However, again using the process of FIG. 4, it will be noted that the input digital word for code −1024 [10000000000] (in MSB to LSB format) is converted also with the MODE pattern of AAAAAAAAAAB (from LSB to MSB), but the last "1" is converted with a MODE B cycle that generates a positive error. The magnitudes of the positive error and negative error are almost equal, but this introduces the sharp changing in error shown in FIG. 7 at the MSB transition points.

Figure 11:
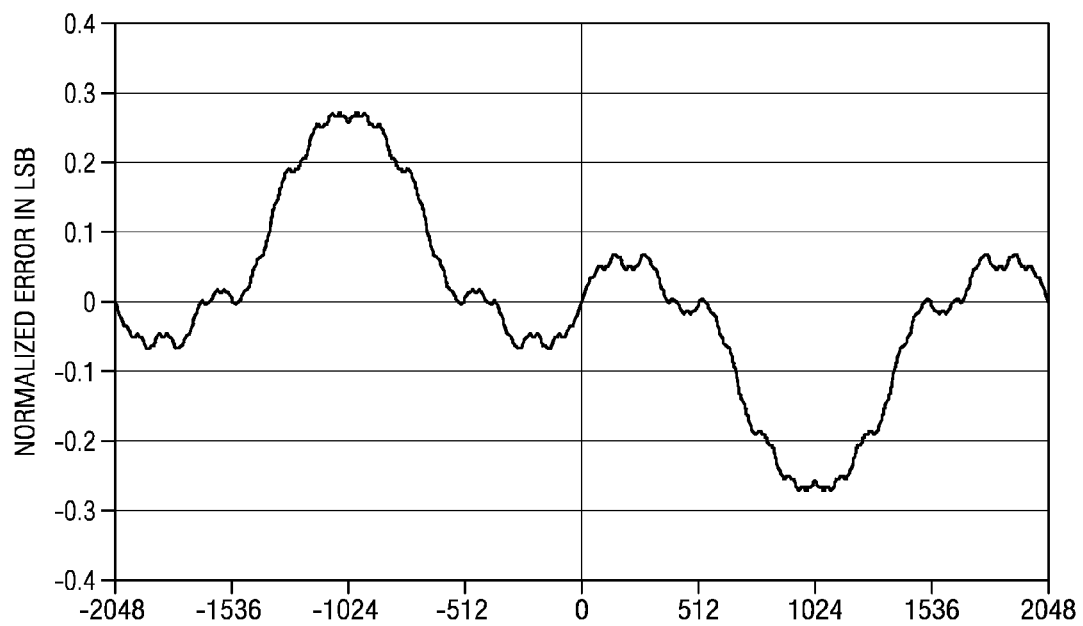
FIG. 11 graphs a measurement of absolute error for a cyclic DAC operating with capacitor swapping in accordance with the process of FIGS. 5-6.
Figure 12:
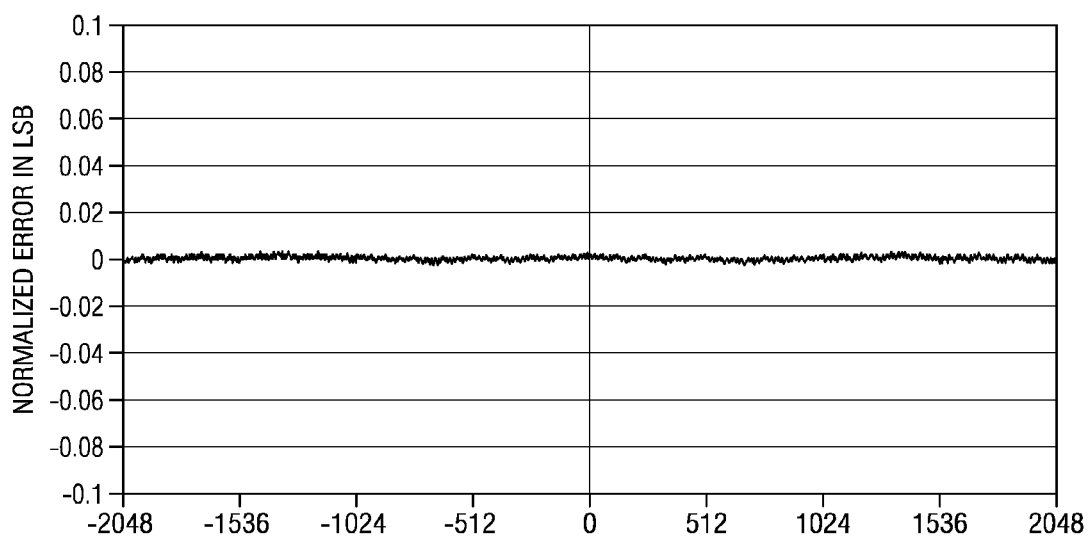
FIG. 12 graphs a measurement of error in dynamic non-linearity (DNL) for a cyclic DAC operating with capacitor swapping in accordance with the process of FIGS. 5-6.

The processes of FIGS. 5 and 6 address the MSB transition DNL error which arises with use of the process of FIG. 4. The processes of FIGS. 5 and 6 were simulated for all possible signed 12-bit digital words and a measurement was made of absolute error as function of the signed 12-bit digital word. FIG. 11 is a graphic presentation of the measured absolute error. It is noted that the error does not change much (approximately ±0.25 LSB) over the extent of the signed 12-bit digital words. However, unlike FIG. 9, there is no sharp change in error observed with respect to each MSB transition (i.e., the MSB in the digital word transitioning from "0" to "1" or vice versa). FIG. 12 is a graphic presentation of the error in dynamic non-linearity (DNL). For nearly all of the signed 12-bit digital words, there is negligible error in DNL, and the spike shown in FIG. 10 for the process of FIG. 4 at the MSB boundary is no longer present.

The foregoing is explained by further examining conversion at the MSB boundary. Using the process of FIGS. 5 and 6, it will be noted that the input digital word for code −1023 [01111111111] (in MSB to LSB format) is still converted with the MODE pattern of AAAAAAAAAAB (from LSB to MSB) generating a cumulative negative error. However, again using the process of FIGS. 5 and 6, it will be noted that the input digital word for code −1024 [10000000000] (in MSB to LSB format) is now converted with the MODE pattern of BBBBBBBBBBBA (from LSB to MSB). Here, the last "1" is converted with a MODE A cycle that also generates a negative error. These negative errors have substantially the same magnitude, and thus the normalized error curve of FIG. 11 becomes continuous at the MSB boundary, and FIG. 12 shows the absence of an error step (compared to FIG. 10).

The following presents an explanation of DNL improvement at MSB transition with respect to the process of FIGS. 5 and 6. Specifically, an investigation is made of the error of conversion while converting successively [01 . . . 1] and [10 . . . 0] using a same MODE configuration (MODE A, for example), assuming the number of bits is large. Again, it will be remembered that the MSB transition has been shown to be the worst case for the DNL.

First of all, the expression of the conversion result is as follows: consider Cx as the sampling capacitor and Cy as the integrating capacitor.

$Cx=C; Cy=C+\Delta C;$ and $e_C=\Delta C/C$

Thus: $V_o^n=V_o^{n-1}*(1+e_C)/(2+e_C)+Vref*b_n/(1+e_C)$

Assuming that $e_C \ll 1$, the expression can be simplified and it can be shown that:

$V_o^n=V_o^{n-1}/2*(1+e_C/2)+Vref/2*b_n*(1-e_C/2)$

Considering N bits and assuming $b_o \ldots b_{n-2}=1, b_{N-1}=0$, converting [01 . . . 1];

Then, the conversion value is: $V_o^{N-1}=Vref/2*(1-e_C/2*series)$, wherein "series" is converging towards 1 when N becomes larger.

In other words the error is converging to: $e_f=-Vref/4*e_C$

Considering N bits and assuming $b_o \ldots b_{n-2}=0, b_{N-1}=1$, converting [10 . . . 0];

The conversion value is: $V_o^{N-1}=Vref/2*(1+e_C/2)$; and the error is: $e_f=Vref/4*e_C$ One can then observe that by swapping the Cx and Cy functions, it becomes:

$V_o^n=V_o^{n-1}/2*(1-e_C/2)+Vref/2*b_n*(1+e_C/2)$

In other words, it is possible to transform a positive error to a negative error by swapping Cx and Cy roles.

The leads to the conclusion that MSB can be used as in FIGS. 5 and 6 to select the initial MODE (MODE A for MSB=0 and MODE B for MSB=1) to control the process generate overall error of a same sign value at MSB transitions. By doing so, there will not be any step in the DAC output while the MSB change is occurring. The result is well illustrated when looking at the improvement in the normalized error on FIG. 11 versus FIG. 9. There is no longer a "step/discontinuity" at the location where the MSB is changing (−1024/−1024).

While this detailed description has set forth some embodiments of the present invention, the appended claims cover other embodiments of the present application which differ from the described embodiments according to various modifications and improvements. Other applications and configurations may be apparent to the person skilled in the art.

What is claimed is:

1. A cyclic digital-to-analog converter, comprising:
   a first capacitor;
   a second capacitor;
   switching circuitry connected to the first and second capacitors, wherein the switching circuit is adapted to configure the first and second capacitors in at least a first mode where the first capacitor functions as a sampling capacitor and the second capacitor functions as a holding capacitor, and wherein the switching circuitry is adapted to configure the first and second capacitors in at least a second mode where the first capacitor functions as the holding capacitor and the second capacitor functions as the sampling capacitor; and
   a switch control circuit coupled to the switching circuitry, the switch control circuit adapted to receive a digital word to be converted and control the switching circuit to change from configuration in the first mode for a one bit of the digital word to configuration in the second mode for another bit of the digital word if the one bit and another bit of the digital word are adjacent one another and have different logical values and otherwise not change from configuration in the first mode if the one bit and another bit of the digital word have same logical values.

2. The converter of claim 1, wherein the digital word has a most significant bit and a least significant bit, and wherein the switch control circuit is further adapted to control configuration of the switching circuit to select one of the first mode or second mode as an initial mode for processing the least significant bit based on a logical value of the most significant bit.

3. The converter of claim 2, wherein the first mode is selected as the initial mode if the logical value of the most significant bit is logic low.

4. The converter of claim 1, wherein the digital word has a most significant bit and a least significant bit, and wherein the switch control circuit is further adapted to control configuration of the switching circuit to select one of the first mode or second mode as an initial mode for processing the least significant bit.

5. The converter of claim 4, wherein the first mode is selected as the initial mode by default.

6. A cyclic digital-to-analog converter, comprising:
   a first capacitor;
   a second capacitor;
   switching circuitry selectively configurable to connect the first and second capacitors in at least two modes of operation, wherein a first mode uses the first capacitor during conversion of a bit as a sampling capacitor and uses the second capacitor during conversion of that bit as a holding capacitor, and wherein a second mode uses the second capacitor during conversion of a bit as a sampling capacitor and uses the first capacitor during conversion of that bit as a holding capacitor; and
   a controller adapted to swap from configuration in the first mode to configuration in the second mode for bit conversion when adjacent bits of a digital word to be converted have different logical values.

7. The converter of claim 6, wherein the controller is further adapted to swap from configuration in the second mode to configuration in the first mode for bit conversion when adjacent bits of a digital word to be converted have different logical values.

8. The converter of claim 6, wherein the controller is further adapted to maintain configuration in the first mode for bit conversion when adjacent bits of a digital word to be converted have same logical values.

9. The converter of claim 6, wherein the controller is further adapted to maintain configuration in the second mode for bit conversion when adjacent bits of a digital word to be converted have same logical values.

10. The converter of claim 6, wherein the digital word has a most significant bit and a least significant bit, and wherein the controller is further adapted to select one of the first mode or second mode as an initial mode for processing the least significant bit based on a logical value of the most significant bit.

11. The converter of claim 10, wherein the first mode is selected as the initial mode if the logical value of the most significant bit is logic low.

12. The converter of claim 6, wherein the digital word has a most significant bit and a least significant bit, and wherein the controller is further adapted to select one of the first mode or second mode as an initial mode for processing the least significant bit.

13. The converter of claim 12, wherein the first mode is selected as the initial mode by default.

14. A method for controlling configuration of a first capacitor and a second capacitor for use in a cyclical digital-to-analog conversion of a digital word to be converted, comprising:
configuring the first and second capacitors in a first mode using the first capacitor as a sampling capacitor and the second capacitor as a holding capacitor;
converting one bit of the digital word using the first and second capacitors configured in the first mode;
determining whether the one bit and another bit of the digital word which is adjacent the one bit have different logical values;
if so, configuring the first and second capacitors in a second mode using the second capacitor as the sampling capacitor and the first capacitor as the holding capacitor; and
then converting the another, adjacent, bit of the digital word using the first and second capacitors configured in the second mode.

15. The method of claim 14, further comprising:
if determining indicates that the one bit and another bit of the digital word which is adjacent the one bit have same logical values, then converting the another, adjacent, bit of the digital word using the first and second capacitors configured in the first mode.

16. The method of claim 14, wherein the digital word has a most significant bit and a least significant bit, and further comprising selecting the first mode as an initial mode for converting the least significant bit if a logical value of the most significant bit is low.

17. The method of claim 14, wherein the digital word has a most significant bit and a least significant bit, and further comprising selecting the second mode as an initial mode for converting the least significant bit if a logical value of the most significant bit is high.

18. The method of claim 17, further comprising:
if determining indicates that the least significant bit and a bit adjacent the least significant bit in the digital word have different logical values, then converting the bit adjacent the least significant bit of the digital word using the first and second capacitors configured in the first mode.

19. The method of claim 14, wherein the digital word has a most significant bit and a least significant bit, and wherein the controller is further adapted to select the first mode as an initial mode for converting the least significant bit.

* * * * *